United States Patent
Henle et al.

(10) Patent No.: US 11,843,131 B2
(45) Date of Patent: Dec. 12, 2023

(54) ELECTRICAL CONTACT BETWEEN AN ELECTRICAL CONDUCTOR OF A CONDUCTOR OF A CONDUCTOR CABLE AND A CONNECTING COUNTERPART, CELL CONNECTING SYSTEM FOR A VEHICLE BATTERY MODULE AND METHOD FOR MANUFACTURING THE CELL SYSTEM

(71) Applicants: TE Connectivity Germany GmbH, Bensheim (DE); TE Connectivity Belgium BV, Oostkamp (BE); Tyco Electronics France SAS, Pontoise (FR)

(72) Inventors: Martin Henle, Woert (DE); Szilard Eberhardt, Woert (DE); Marco Wagner, Woert (DE); Olivier Dalino, Pontoise (FR); Koen Liebaert, Oostkamp (BE); Aniruddha Berikai Vasu, Woert (DE); Andre Martin Dressel, Woert (DE); Jochen Brandt, Woert (DE); Christopher Joest, Woert (DE); Christoph Rennefeld, Woert (DE); Thorsten Callies, Woert (DE); Florian Brabetz, Woert (DE); Uwe Hauck, Woert (DE); Ralf Gollee, Woert (DE); Rudi Blumenschein, Woert (DE); Gerzson Toth, Woert (DE); Josef Sinder, Woert (DE)

(73) Assignees: TE Connectivity Belgium BV, Oostkamp (BE); TE Connectivity Germany GmbH, Bensheim (DE); Tyco Electronics France SAS, Pontoise (FR)

(*) Notice: Subject to any disclaimer, the term of this patent is extended or adjusted under 35 U.S.C. 154(b) by 158 days.

(21) Appl. No.: 17/213,329

(22) Filed: Mar. 26, 2021

(65) Prior Publication Data
US 2021/0305663 A1      Sep. 30, 2021

(30) Foreign Application Priority Data

Mar. 27, 2020 (EP) .................................. 20305353
May 5, 2020 (DE) ......................... 102020112089.3
Feb. 4, 2021 (EP) .................................. 21305149

(51) Int. Cl.
*H01M 50/528* (2021.01)
*H01R 43/02* (2006.01)
(Continued)

(52) U.S. Cl.
CPC ....... *H01M 50/528* (2021.01); *H01M 50/569* (2021.01); *H01R 4/625* (2013.01); *H01R 43/0221* (2013.01)

(58) Field of Classification Search
CPC ............ H01M 50/528; H01M 50/569; H01M 50/249; H01M 2220/20; H01M 50/502;
(Continued)

(56) References Cited

U.S. PATENT DOCUMENTS 5,281,762 A * 1/1994 Long .................. H01R 12/598
  29/857
5,676,865 A   10/1997 Chang
(Continued)

FOREIGN PATENT DOCUMENTS

DE      102004038401 A1    5/2005
DE   10 2014 219 178 A1    3/2016
(Continued)

OTHER PUBLICATIONS

Extended European Search Report, Application No. 21165143.5-1201, dated Dec. 20, 2021, 10 pages.

*Primary Examiner* — Abdullah A Riyami
*Assistant Examiner* — Nader J Alhawamdeh
(74) *Attorney, Agent, or Firm* — Barley Snyder

(57) ABSTRACT

An electrical device including a conductor cable having an electrical conductor embedded in an insulation sheath of the
(Continued)

conductor cable in a contact plane. The electrical conductor is stripped of the insulation sheath in a predetermined contact section at least on one contact side, the contact section of the conductor is bent out with the contact side from the contact plane to beyond the insulation sheath. The device further includes an electrical connection counterpart. The contact side of the contact section of the conductor rests on the electrical connection counterpart and is connected directly to the electrical connection counterpart to form an electrical contact.

23 Claims, 11 Drawing Sheets

(51) Int. Cl.
  *H01R 4/62* (2006.01)
  *H01M 50/569* (2021.01)
(58) Field of Classification Search
  CPC .... H01R 4/625; H01R 43/0221; H01R 12/62; H01R 4/029; H01R 43/02; H01R 43/28; H01R 4/62; H05K 3/361; H05K 1/144; H05K 3/321; H05K 1/118; H05K 3/328; H05K 3/363; H05K 3/368; H05K 2201/10287; H05K 2203/049; Y02E 60/10
  See application file for complete search history.

(56) References Cited

U.S. PATENT DOCUMENTS

| | | | |
|---|---|---|---|
| 5,900,587 A | 5/1999 | Piper et al. | |
| 6,148,510 A * | 11/2000 | Yokoi | H01R 43/0263 |
| | | | 29/878 |
| 10,391,882 B2 * | 8/2019 | Aschwer | H01M 50/507 |
| 10,992,068 B2 * | 4/2021 | Suzuki | H01R 9/0512 |
| 2008/0296273 A1 | 12/2008 | Lei et al. | |
| 2018/0268959 A1 * | 9/2018 | Kim | B60R 16/0215 |
| 2021/0305663 A1 * | 9/2021 | Henle | H01R 43/28 |

FOREIGN PATENT DOCUMENTS

| | | |
|---|---|---|
| EP | 0699353 B1 | 6/1997 |
| JP | 2002270252 A1 | 9/2002 |
| JP | 2012146353 A1 | 8/2012 |
| WO | 2012102091 A1 | 8/2012 |

* cited by examiner

ELECTRICAL CONTACT BETWEEN AN ELECTRICAL CONDUCTOR OF A CONDUCTOR OF A CONDUCTOR CABLE AND A CONNECTING COUNTERPART, CELL CONNECTING SYSTEM FOR A VEHICLE BATTERY MODULE AND METHOD FOR MANUFACTURING THE CELL SYSTEM

CROSS-REFERENCE TO RELATED APPLICATIONS

This application claims priority under 35 U.S.C. § 119 to European Patent Application No. 20305353.3, filed Mar. 27, 2020, German Patent Application No. 102020112089.3, filed on May 2, 2020, and European Patent Application No. 21305149.3, filed on Feb. 4, 2021.

FIELD OF THE INVENTION

The present disclosure relates to electrical contacts, and in particular, to an electrical device including an electrical contact formed between an electrical conductor of a cable and an electrical connection counterpart.

BACKGROUND

Electrical connection arrangements, such as those disclosed in EP 0 699 353 B1, include a flexible circuit arrangement connected to a planar substrate. The flexible circuit arrangement comprises a flexible flat strip, wherein the circuit arrangement is bent back onto itself at least with one end in the longitudinal direction forming an elastic spring such that the upper side of the section that is bent back is located adjacent to the surface of the section of the strip that is not bent back. The conductors are not insulated on the surface side opposite the surface that is bent back such that they can be pressed resiliently against conductive traces of the planar substrate. In a further embodiment of the prior art, the flexible flat conductor cable comprises an indentation in the direction of the contacts, wherein the indentation rests on the contacts.

Similarly, battery cell connecting systems are known in the art, for example, from DE 102014219178A1 that are used in battery modules of electrical or hybrid vehicles to connect a plurality of battery cells with each other. To be able to monitor the status of the cells, it is necessary to monitor parameters, for example, the cell temperature, the capacity or the loading status. To do so, a monitoring unit is electrically connected via an electrical cable to each one of the cells via the contact element of the cell connecting system. The monitoring unit can also be used to balance the cells.

In order to ensure a sufficiently long lifetime of the battery module, it is important to implement connections that are electrically and mechanically stable even in daily use during which vibrations, shocks, and the like put mechanical stress onto the connections. Car manufactures therefore impose strict requirements on the reliability of the connection. For example, a 90° peel tension test is carried out, ensuring the connection supports a force of at least 7 newton (N) before the connection breaks. During the 90° peel tension test a previously connected cable is bent to a 90° to be perpendicular to the contact surface. A force at which the connection peels off is then measured. The machine capability characteristic value (Cmk) should be larger than 1.67.

Accordingly, there exists a need for improved electrical contacts, and methods for establishing the same, between an electrical conductor of a conductor cable, in particular between a flexible flat conductor cable, and a connection counterpart. In the case of a battery cell connection system, in order to meet the above requirements, there is likewise a need to improve the mechanical reliability of these connections, and therefore improve the monitoring capability of a battery.

SUMMARY

In one embodiment of the present disclosure, an electrical device includes a conductor cable having an electrical conductor embedded in an insulation sheath of the conductor cable in a contact plane. The electrical conductor is stripped of the insulation sheath in a predetermined contact section at least on one contact side, the contact section of the conductor is bent out with the contact side from the contact plane to beyond the insulation sheath. The device further includes an electrical connection counterpart. The contact side of the contact section of the conductor rests on the electrical connection counterpart and is connected directly to the electrical connection counterpart to form an electrical contact.

BRIEF DESCRIPTION OF THE DRAWINGS

The invention will now be described by way of example with reference to the accompanying Figures, of which.

DETAILED DESCRIPTION OF THE EMBODIMENTS

Figure 1:
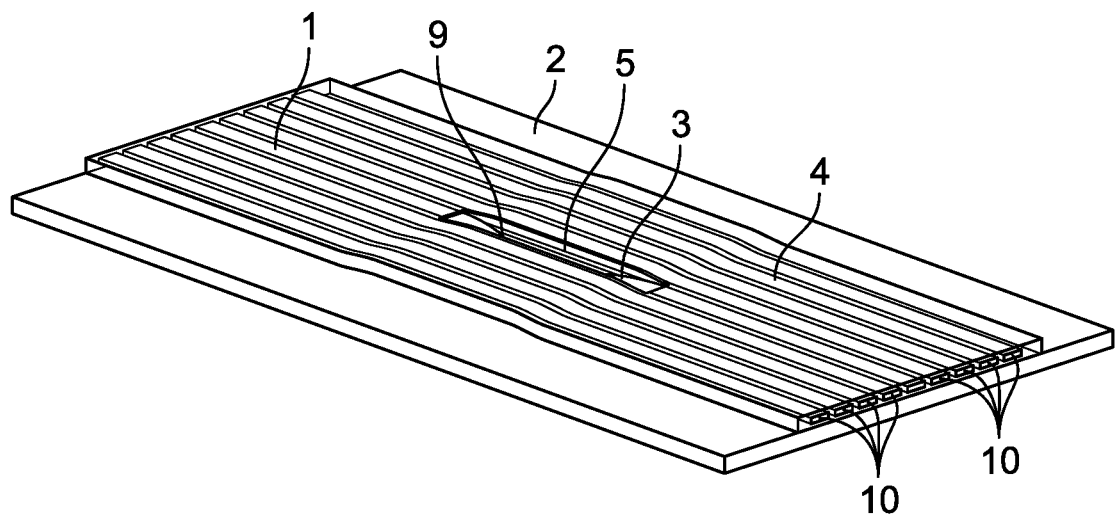
FIG. 1 shows a schematic perspective representation of a flexible flat conductor cable and an electrical contact.

Technical solutions of the present disclosure will be described hereinafter in detail through embodiments and with reference to the attached drawings. In the specification, the same or the like reference numerals refer to the same or the like elements. The illustration of the embodiments of the present disclosure made with reference to the attached drawings is aimed to explain the general inventive concept of the present disclosure, not to be construed as a limitation of the present disclosure.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIGS. 1 to 15 illustrate embodiments of a first object of the invention. Specifically, FIG. 1 shows a schematic representation of a conductor cable 1 which rests on an electrical connection counterpart 2. In this and the following embodiments, a flexible flat conductor cable is used, but the invention is not limited thereto, any type of conductor cable having at least one electrical conductor embedded in an insulation sheath can be used.

The flexible flat conductor cable 1 comprises several electrical conductors 3, 10 which are embedded in an insulation sheath 4. In the embodiment shown, flexible flat conductor cable 1 comprises nine electrical conductors 3, 10 which are embedded in the insulation sheath 4. An electrical conductor 3 is stripped of its insulation sheath 4 in a contact section 5. This means that electrical conductor 3 is freed from the material of insulation sheath 4 on all sides in the region of contact section 5. In addition, electrical conductor 3 rests with the contact section with one contact side on electrical connection counterpart 2.

Figure 2:
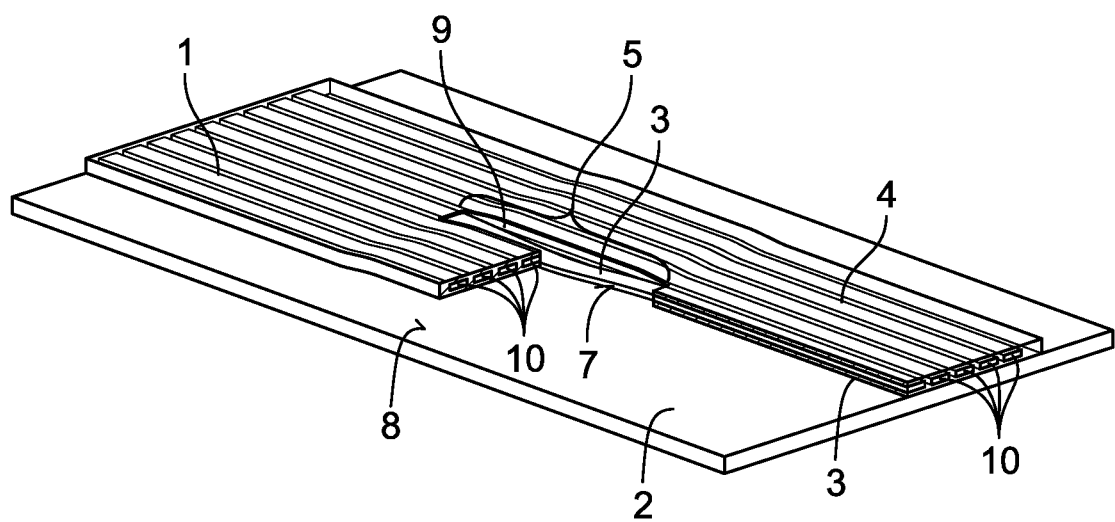
FIG. 2 shows a schematic partial sectional representation of the flexible flat conductor cable and the electrical contact according to FIG. 1.

FIG. 2 shows the arrangement of FIG. 1 in a schematic partial cross-section that runs along electrical conductor 3. It can be clearly seen that electrical conductor 3 has been freed of insulation sheath 4 in the contact section 5. In addition, electrical conductor 3 rests with contact section 5 and with one contact side on the upper side of electrical connection counterpart 2. Remaining electrical conductors 10 of flexible flat conductor cable 1 are completely embedded in the insulation sheath. Depending on the embodiment selected, further electrical conductors 10 can also be stripped off the insulating material of the insulation sheath in a contact section and rest with one contact side on electrical connection counterpart 2. Viewed in the longitudinal direction of flexible flat conductor cable 1, the stripped contact sections of further electrical conductors 10 can be arranged at the same height or in different longitudinal sections of flexible flat conductor cable 1.

Figure 3:
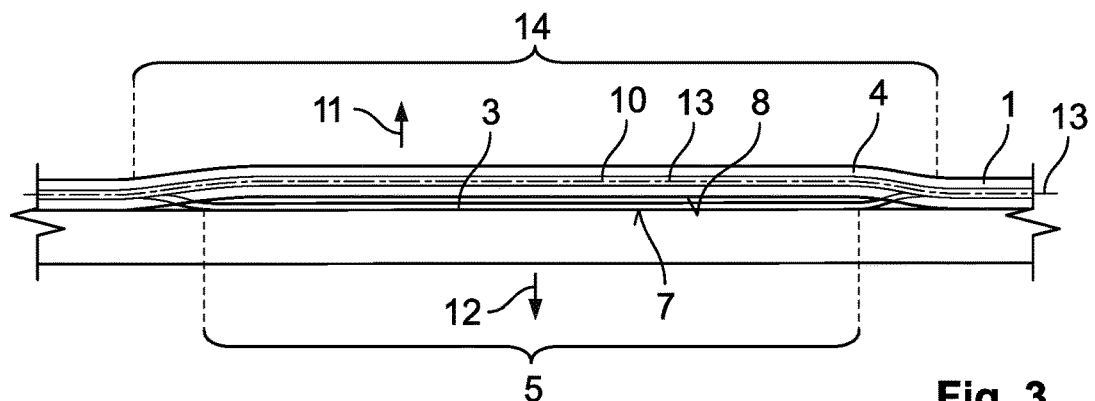
FIG. 3 shows a cross section in the longitudinal direction of the flexible flat conductor cable of FIG. 1.

FIG. 3 shows a schematic cross section of the arrangement of FIG. 1. Insulation sheath 4 comprises a recess 9 in the region of contact section 5. It can be seen in the illustration in FIG. 3 that flexible flat conductor cable 1 rests laterally of the contact section 5 with insulation sheath 4 on the upper surface side 8 of the electrical connection counterpart 2 of the electrical contact. In the region of the contact section 5, however, flexible flat conductor cable 1 is bent upwardly in a second direction 11 from the upper surface side 8 of electrical contact 2. In addition, electrical conductor 3 is bent in the region of contact section 5 from a contact plane 13 of insulation sheath 4 in a first direction 12 downwardly in the direction towards the electrical connection counterpart 2. Contact plane 13, in which electrical conductors 3, 10 of the flexible flat conductor cable are arranged in insulation sheath 4, is typically formed at the center of the insulation sheath 4. The bending of the conductor 3 in the direction toward connection counterpart 2 enables a contact side 7 of the electrical conductor 3 to rest securely on the upper side 8 of the electrical contact 2. In addition, cable section 14, which is bent upwardly in the second direction 11, can be used to exert a pretension of contact section 5 of electrical conductor 3 in the direction of the electrical connection counterpart 2. This results in easier bending of the conductor 3 in the direction of the connection counterpart 2 without having to deform conductor 3.

Depending on the embodiment selected, flexible flat conductor cable 1 can also rest in a planar manner on connection counterpart 2 in the region of contact section 5. In the exemplary embodiment, however, the conductor 3 is deformed, in particular stretched, to allow the flexion in the direction towards the connection counterpart 2.

Figure 4:
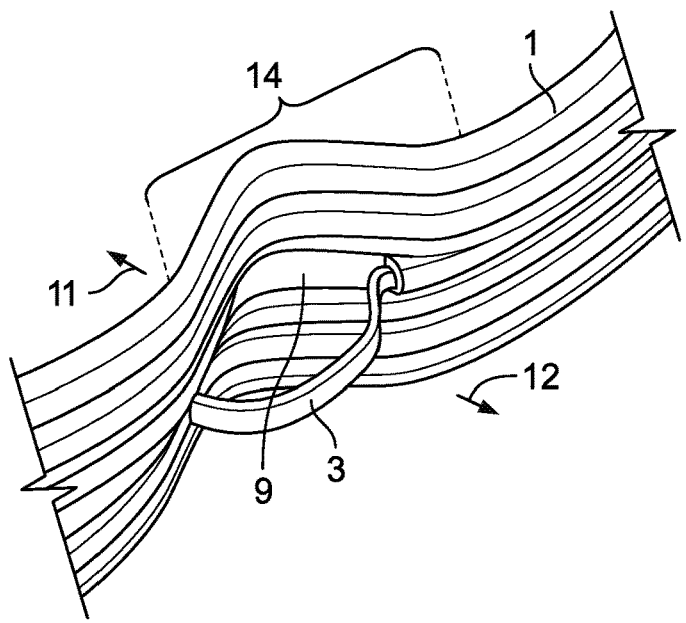
FIG. 4 shows an embodiment of a flexible flat conductor cable with an electrical conductor that is bent out.

FIG. 4 shows, in a perspective representation, a further embodiment of a flexible flat conductor cable 1 with an electrical conductor 3 which is bent in the first direction 12 out of the insulation sheath 4. At the same time, a cable section 14 has a bent shape in a second direction 11, which is arranged opposite to the first direction 12, in the region of contact section 5 with respect to the remaining part of the flexible flat conductor cable 1 extending in a planar manner.

Figure 5:
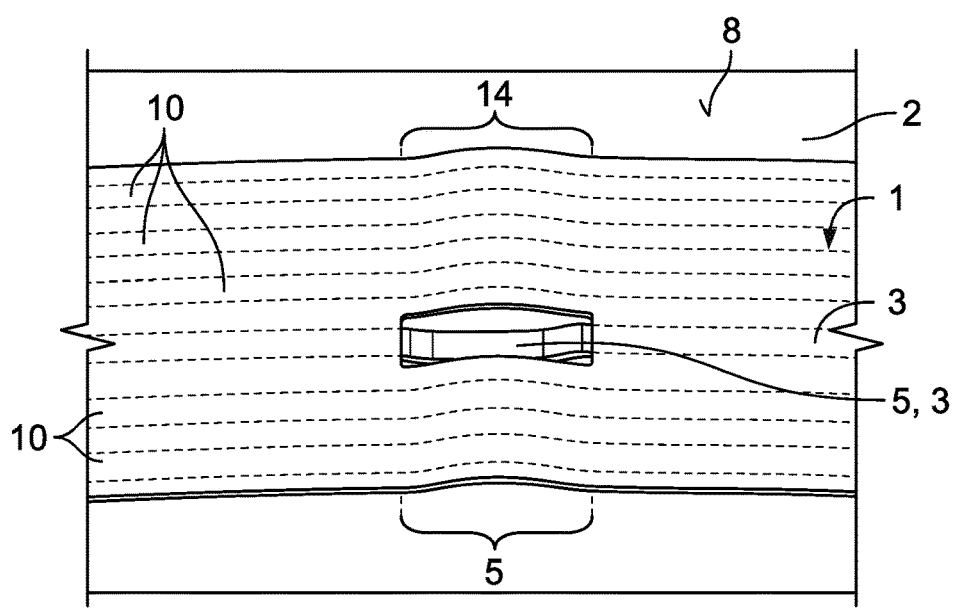
FIG. 5 shows a top view of a flexible flat conductor cable according to FIG. 4, wherein the electrical conductor rests on the electrical connection counterpart.
Figure 6:
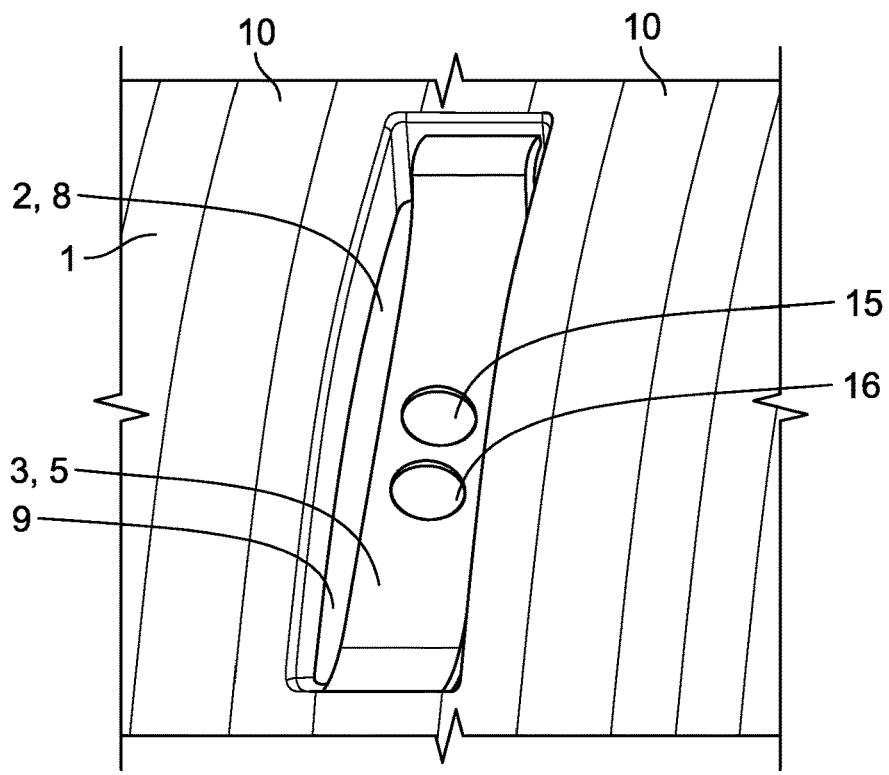
FIG. 6 shows a partial section of a top view of the flexible flat conductor cable, wherein an electrical conductor is connected to the electrical connection counterpart by way of contact points or weld spots.

FIG. 5 shows the flexible flat conductor cable 1 of FIG. 4 which is placed on the electrical connection counterpart 2. The contact section 5 of the electrical conductor 3 rests on the upper side 8 of the electrical connection counterpart 2. The flexible flat conductor cable 1 in this embodiment comprises six electrical conductors 3, 10, which are shown with dashed lines. The electrical conductor 3 is not yet mechanically connected with its contact section 5 to the electrical connection counterpart 2, but only rests on the upper side 8 of the electrical connection counterpart 2. In a subsequent method step, the contact section 5 of the electrical conductor 3 is connected to the upper side 8 of the electrical connection counterpart 2. For example, welded connections, adhesive connections, or solder connections can be used for this purpose. Laser-welded connections in particular can be used as the welded connections. Welding of the contact section 5 of the electrical conductor 3 to the upper side 8 of the electrical contact 2 is achieved with a laser beam. Depending on the embodiment selected, one or more weld spots 15 can be used, as shown in FIG. 6. As an alternative to laser welding, ultrasonic welding could be used as well.

FIG. 6 shows in an enlarged illustration a detail of the arrangement of FIG. 5, wherein the electrical conductor 3 is welded to the electrical connection counterpart 2 using two weld spots 15, 16. Depending on the embodiment selected, only one weld spot or also more than two weld spots can be used. In addition, an elongated, rectangular, or jagged shape of the welded connection can also be selected instead of the round shape of the weld spot. For example, the welded connection can be created with the aid of a laser beam which is guided in a spiral shape from a center point of the weld spot to the edge region of the weld spot.

Figure 7:
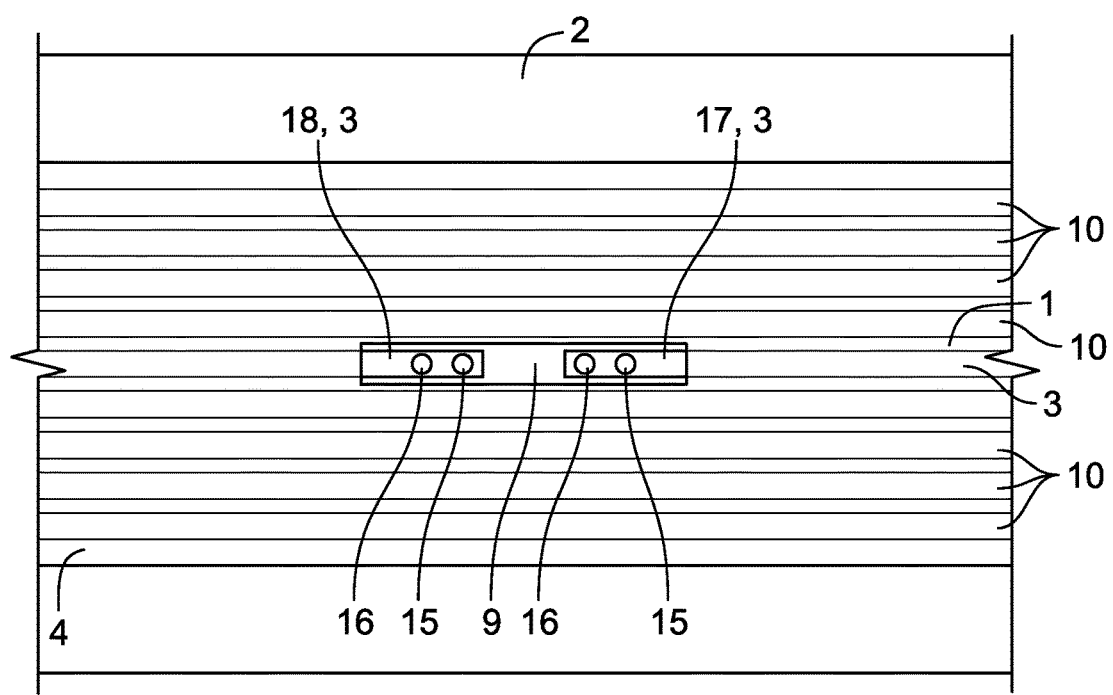
FIG. 7 shows a schematic representation of a further embodiment of a flexible flat conductor cable, wherein an electrical conductor is connected with two partial sections to the electrical connection counterpart.

FIG. 7 shows a perspective representation of a further device with electrical contact between an electrical conductor 3 of a flexible flat conductor cable 1 and an electrical connection counterpart 2. The representation in FIG. 7 is schematic with a view from above onto the flexible flat conductor cable 1 that is shown placed onto the electrical connection counterpart 2. A recess 9 is introduced into the insulation sheath 4 of flexible flat conductor cable 1, so that a contact section 5 of electrical conductor 3 is stripped off the insulating material of the insulation sheath 4. In addition, the contact section 5 of electrical conductor 3 is divided into a first partial section 17 and a second partial section 18. The first and second partial sections 17, 18 are led out of the contact plane of the insulation sheath 4 downwardly with respect to the flexible flat conductor cable 1 and rest on the upper side 8 of the electrical connection counterpart 2. In addition, each partial section 17, 18 is electrically and mechanically connected to the electrical connection counterpart 2 with two respective weld spots 15, 16. Weld spots 15, 16 can be produced, for example, by laser welding.

Figure 8:
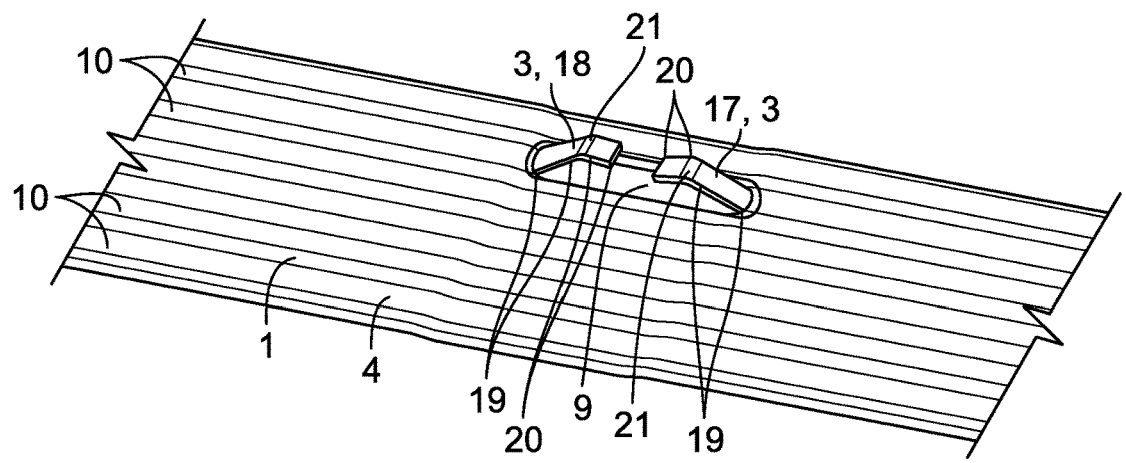
FIG. 8 shows a perspective representation with two partial sections of a flexible flat conductor cable with a view onto an underside of the flexible flat conductor cable, wherein two partial sections of an electrical conductor are led out of the insulation sheath.

FIG. 8 shows the flexible flat conductor cable 1 from FIG. 7 before being placed on the electrical connection counterpart 2. The partial sections 17, 18 of the electrical conductor 3 are bent out of the insulating sheath 4 of the flexible flat conductor cable 1. The partial sections 17, 18 are each divided into a first section 19 and a second section 20. First section 19 extends out from the contact plane 13 of the insulation sheath 4 and is inclined at a predetermined angle relative to contact plane 13. The first section 19 transitions to the second section 20 via a bend 21. Second section 20 has a smaller inclination relative to the contact plane 13 and can be arranged, for example, parallel to the plane of the flexible flat conductor cable 1. The first and second partial sections 17, 18 can be shaped identically so that first sections 19 each have the same angle relative to the plane of flexible flat conductor cable 1 and at which second sections 20 are arranged parallel to one another. This shape of partial sections 17, 18 enables a simplified and improved realization of the electrical contacting between the electrical conductor 3 and the electrical connection counterpart 2.

Due to the shape of the partial sections 17, 18, the second sections 20 of the partial sections 17, 18 have a relatively large contact surface with the upper side 8 of the electrical contact 2 when the flexible flat conductor cable 1 is placed onto the electrical connection counterpart 2. The second sections 20 of the partial sections 17, 18 lay in contact over a large area with the electrical connection counterpart 2. As a result, a large contact surface is provided. In addition, a large surface for forming the connections between the connection counterpart 2 and the partial sections 17, 18 is present.

Figure 9:
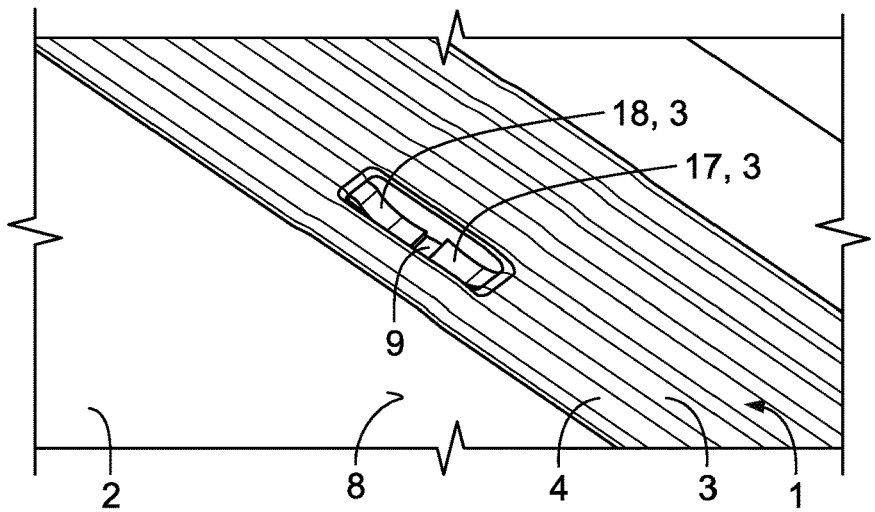
FIG. 9 shows a perspective representation of a flexible flat conductor cable, wherein two partial sections of an electrical conductor rest on an electrical connection counterpart.

FIG. 9 shows flexible flat conductor cable 1 of FIG. 8 which is placed on an electrical connection counterpart 2 so that the partial sections 17, 18 rest with the second sections 20 on the upper side 8 of the electrical connection counterpart 2.

Figure 10:
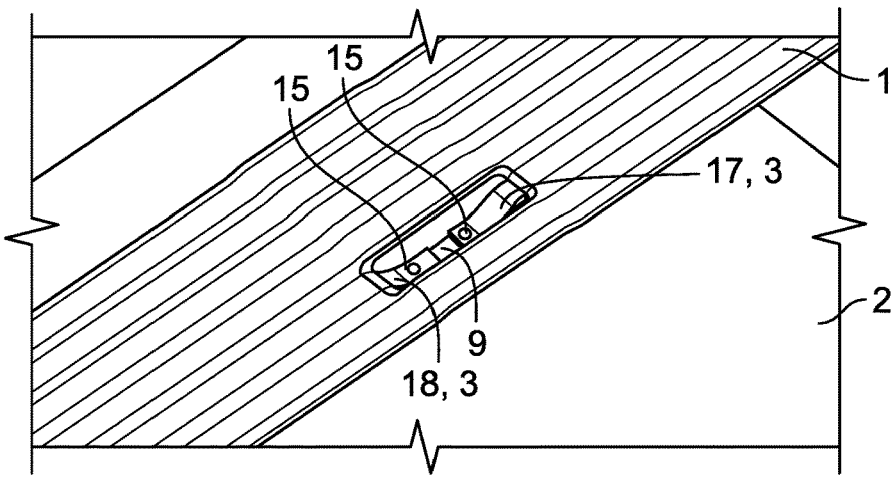
FIG. 10 shows a perspective with two partial sections of the arrangement of FIG. 7.

FIG. 10 shows the arrangement of FIG. 9 after the partial sections 17, 18 have each been welded with a weld spot 15 to electrical connection counterpart 2.

Figure 11:
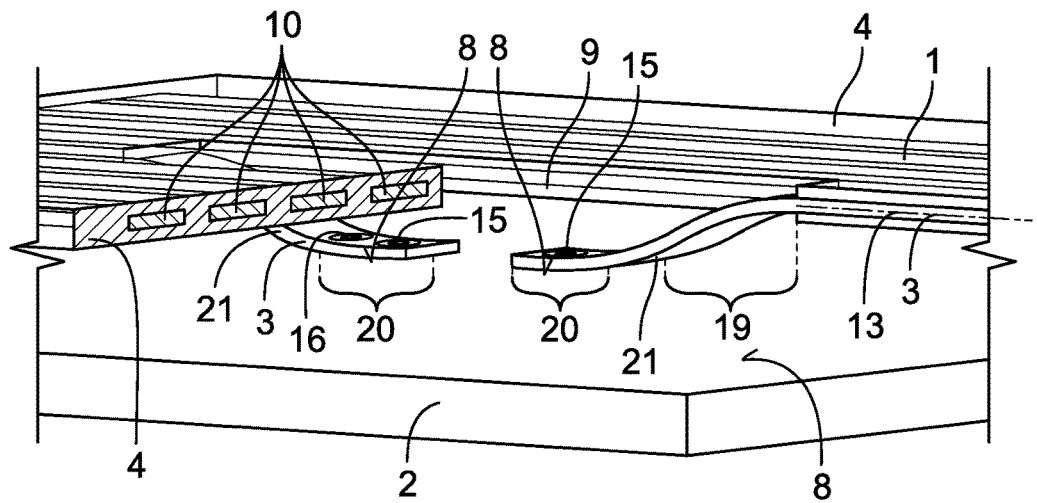
FIG. 11 shows a partial sectional representation of the flexible flat conductor cable and the electrical contact according to FIG. 7.

FIG. 11 shows a schematic partial sectional representation of the arrangement of FIG. 10, wherein the formation of the first sections 19 and the second sections 20 of the partial sections 17, 18 are clearly visible. In the embodiment of FIG. 11, two weld spots 15, 16 are formed in the second sections 20 of the partial sections 17, 18 and connect the partial sections 17, 18 to the electrical connection counterpart 2.

Figure 12:
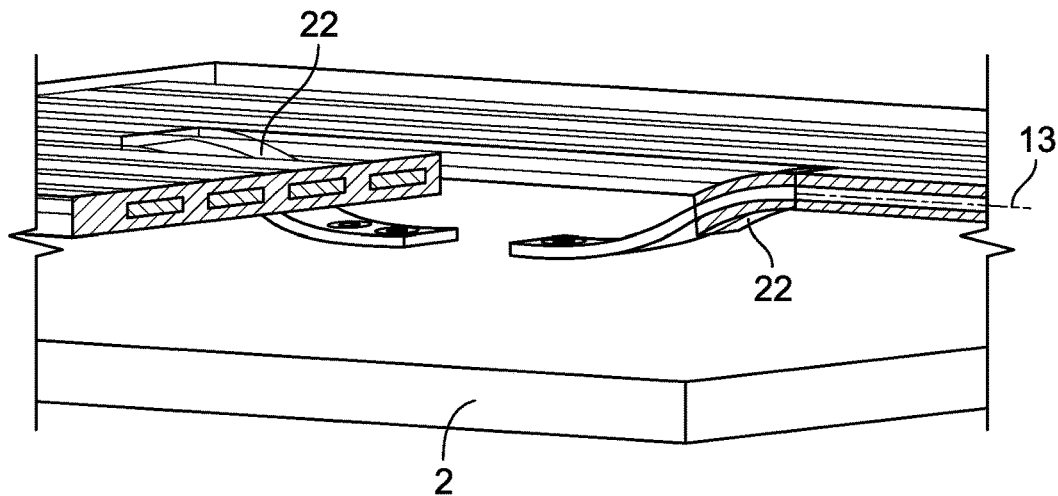
FIG. 12 shows the arrangement of FIG. 11, wherein a partial section of the electrical conductor of the flexible flat conductor cable is embedded in insulating material.

FIG. 12 shows a schematic partial cross-section of a further embodiment of FIG. 7. In this embodiment, the first partial section 17 and the second partial section 18 are embedded in an insulating material 22. The insulating material 22 can be formed, for example, from electrically insulating potting material such as a plastic material. For example, the partial sections 17, 18 stripped off the insulation sheath 4 can be covered at least in part, in particular entirely, with the insulating material 22. A safe and reliable electrical insulation of the partial sections 17, 18 is thus achieved.

In a similar manner, the contact section 5 of the embodiments of FIGS. 1 to 6 can also be covered with the insulating material, in particular with the electrically insulating potting material.

Depending on the embodiment selected, the electrical connection counterpart 2 and the electrical conductor 3 can be formed from different materials. For example, the electrical connection counterpart 2 can be made of aluminum. In addition, electrical conductor 3 can be formed from copper.

Figure 13:
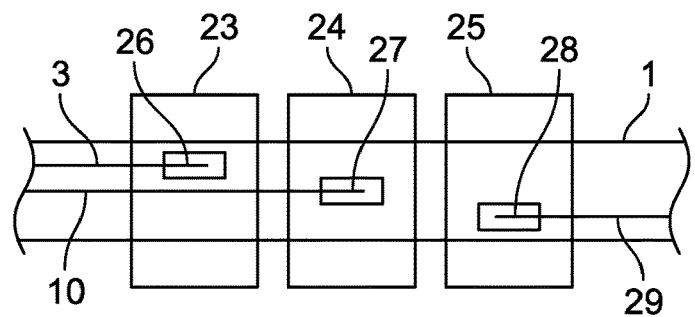
FIG. 13 shows a schematic representation of batteries, the electrical terminals of which are contacted with conductors of a flexible flat conductor cable.

FIG. 13 shows, in a schematic representation, an arrangement of a battery system with several batteries 23, 24, 25, each battery having electrical terminals, some of terminals 26, 27, 28 being shown schematically as rectangles. In addition, a flexible flat conductor cable 1 is led across batteries 23, 24, 25. Flexible flat conductor cable 1 comprises an electrical conductor 3, a further electrical conductor 10, and an additional electrical conductor 29. Electrical conductors 3, 10, 29 are shown schematically only in partial sections, but are formed along the entire flexible flat conductor cable 1. In the embodiment shown, the electrical conductor 3 is connected in an electrically conductive manner to the first terminal 26 of the first battery 23, a further electrical conductor 10 to the second terminal 27 of the second battery 24, and an additional electrical conductor 29 to a third terminal 28 of the third battery 25 according to one of the previously described embodiments of FIGS. 1 to 12. For example, the arrangement of the battery is provided in a vehicle. Electrical terminals 26, 27, 28 of the batteries represent electrical contacts. Depending on the embodiment selected, only one battery can be provided with an electrical terminal that is connected to a conductor of the flexible flat conductor cable. The electrical contact of the electrical terminals of the batteries can be used to detect a voltage of the batteries to balance them and/or a temperature of the batteries. A battery has two terminals which are not shown in this schematic representation.

FIGS. 14a to 14e illustrate a further embodiment according to the invention. Features having the same reference numerals as already used in the description of the Figures above will not be described in detail again but reference made to thereto.

Figure 14A:
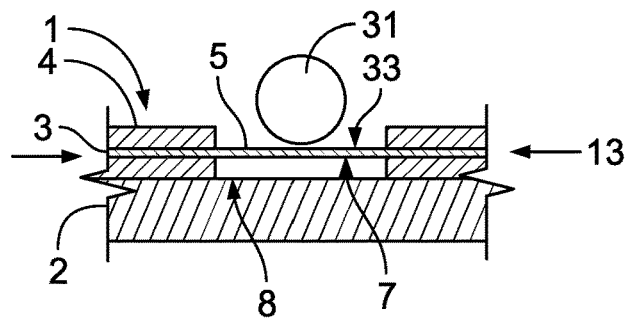
FIGS. 14a to 14e illustrate a schematic representation of a method to bend a contact section onto an electrical connection counter element according to an embodiment of the invention.

FIG. 14a schematically illustrates a side cut view of the conductor cable, here in the exemplary form of a flexible flat conductor cable 1 positioned with its insulation sheath 4 on the electrical connection counterpart 2. The electrical conductor 3 is positioned in the contact plane 13 over its entire length. The contact section 5 is not yet bent towards the surface 8 of the electrical connection counterpart 2. A droplet 31 of a welding material or a glue of a combustive material or an explosive material is positioned on the surface side 33 opposite the contact side 7. Instead of a liquid material, a suitable solid material, e.g. in the form of an explosive cladding provided on the surface side 33 opposite the contact side 7, could also be used.

Figure 14B:
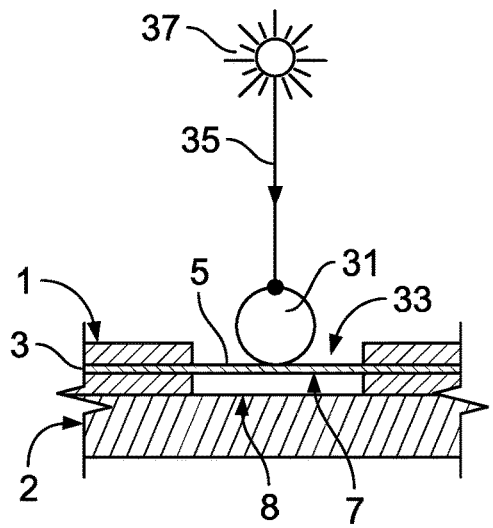

FIG. 14b shows a laser pulse 35 emitted by a pulsed laser 37, impinging on the droplet 31.

Depending on the material used the droplet 31 will immediately evaporate or burn or explode due to the energy transfer. To do so a single laser pulse might be sufficient. In some applications, multiple pulses might be needed.

Figure 14D:
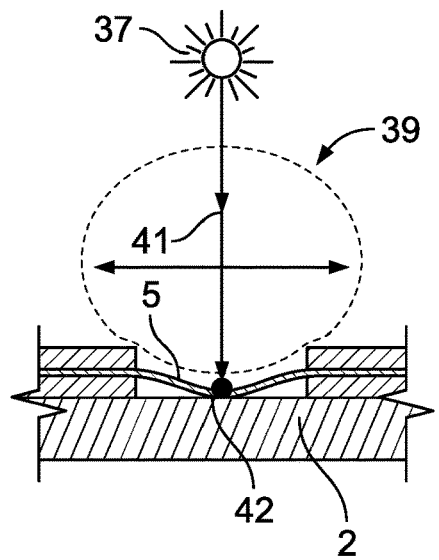
Figure 14C:
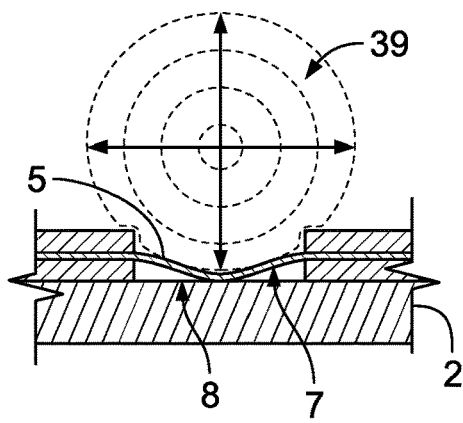

Referring to FIG. 14c, following the phase transition, a pressure wave 39 is formed, quickly expanding and pressing down the contact side 7 of the contact section 5 towards the surface 8 of the electrical connection counterpart 2.

Subsequently, and as illustrated in FIG. 14d, a further laser pulse 41 is emitted by the laser 37 while the contact section 5 is still held down by the pressure wave 39 and impinges on the contact section 5 to weld it to the electrical connection counterpart 2 in weld area 42.

Figure 14E:
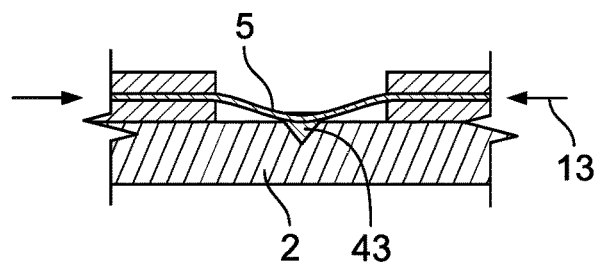

FIG. 14e illustrates the final result. Specifically, the contact section 5 is bent out of the contact plane 13 and is electrically and mechanically connected to the electrical connection counterpart 2. By pressing down the contact section 5 at the moment of the interaction with the laser, a high quality weld 43 can be obtained.

Figure 15A:
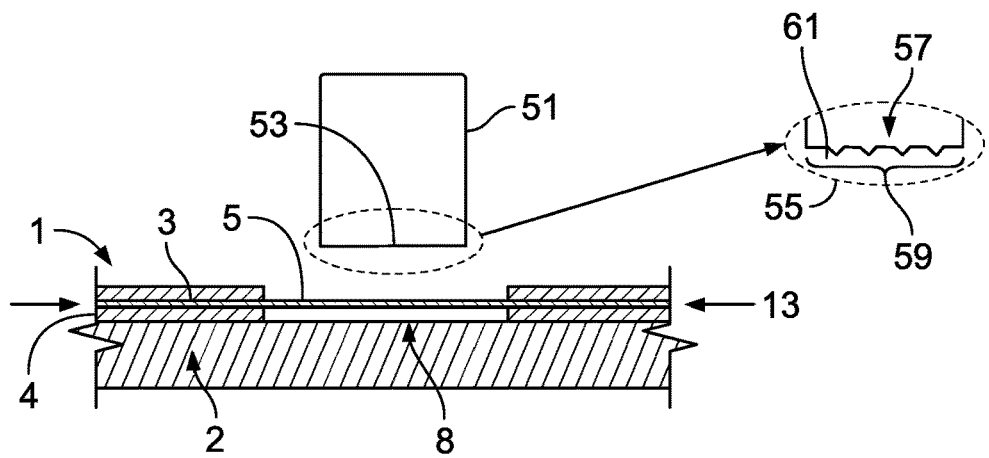
FIGS. 15a to 15c illustrate a schematic representation of a method to emboss a contact section into an electrical connection counter element according to an embodiment of the invention.
Figure 15B:
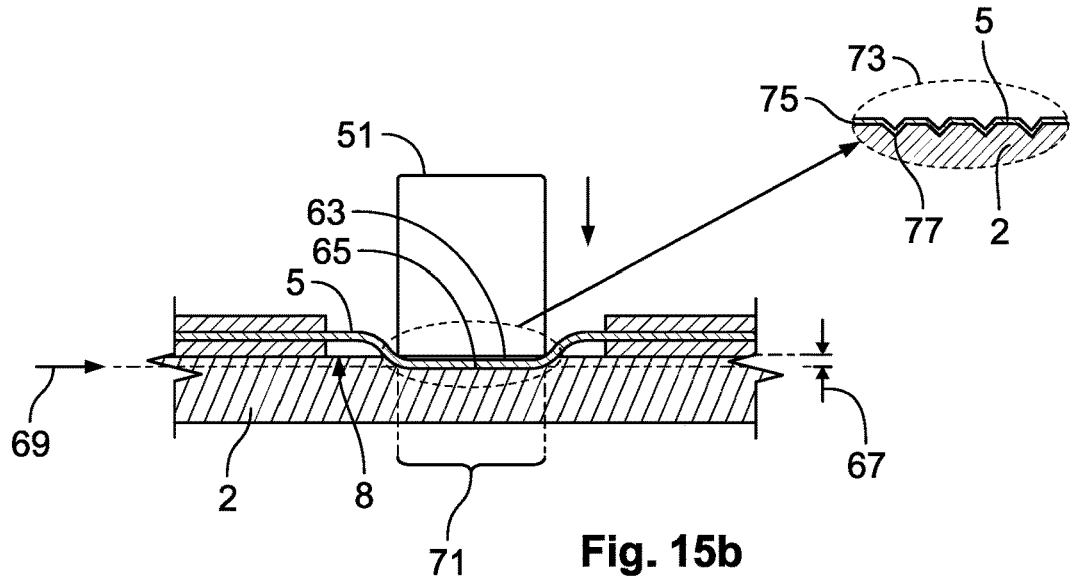
Figure 15C:
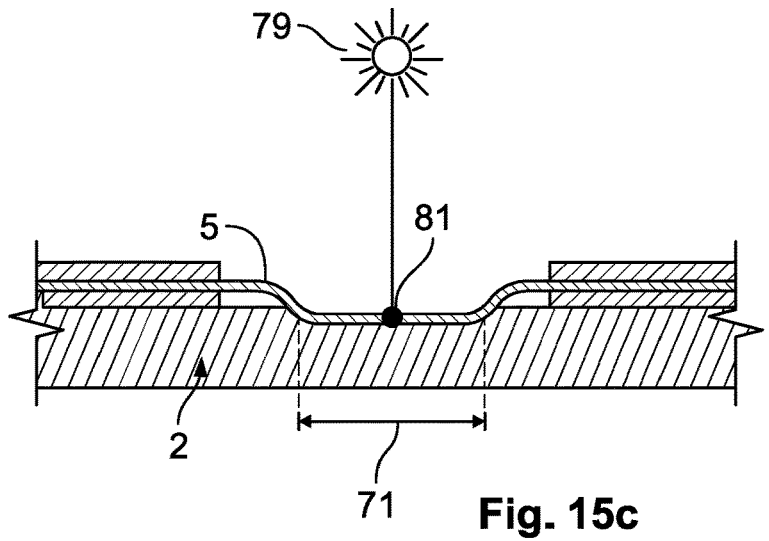

FIGS. 15a to 15c illustrate a further embodiment according to the invention. Features having the same reference numerals as already used in the description of the Figures above will not be described in detail again but reference made to thereto.

FIG. 15a schematically illustrates a side cut view of the conductor cable, for example a flexible flat conductor cable 1 positioned with its insulation sheath 4 on the electrical connection counterpart 2. The electrical conductor 3 is positioned in the contact plane 13 over its entire length. The contact section 5 is not yet bent towards the surface 8 of the electrical connection counterpart 2. A stamping punch 51 is positioned just above the contact section 5. The stamping surface 53 can be a flat surface with or without chamfered edges.

A variant of the embodiment is illustrated in the enlarged zone 55. Here the stamping surface 57 has a structured surface 59, e.g., a plurality of pyramidal shapes 61 that are regularly arranged over the stamping surface 57.

FIG. 15b illustrates the result after the stamping punch 51 has been moved downwards and pushed against the contact section 5 and the surface 8 of the electrical connection counterpart 2. Under the pressure of the stamping punch 51, at least a part 63 of the contact section 5 has been bent and embossed into the surface 65 of the electrical connection counterpart 2. The height 67 of the interface plane 69 of the imprint compared to the surface 8 immediately adjacent the embossed area 71 is of the order of 0.1 to 0.5 mm, preferably, 0.2 to 0.4 mm.

The enlarged zone 73 illustrates the interface 75 when using a stamping punch 51 with a structured surface 59 like illustrated FIG. 15a. Here the contact section 5 and the electrical connection counterpart 2 have mating surface area enhancing features 77 at the interface 75.

Embossing has the advantage that the two parts are positioned with respect to each other without needing additional clamping means, thereby simplifying the manufacturing process.

Subsequently, as illustrated in FIG. 15c, a laser 79 is used to weld the contact section 5 to the electrical connection counterpart 2. One or more weld spots 81 can be realized in the embossed area 71 like in the embodiments mentioned above. As an alternative, ultrasonic welding could be used.

Thus, in this embodiment, the bending and pacing of the contact side on and into the surface 8 of the electrical connection counterpart 2 is realized in one step.

Figure 16:
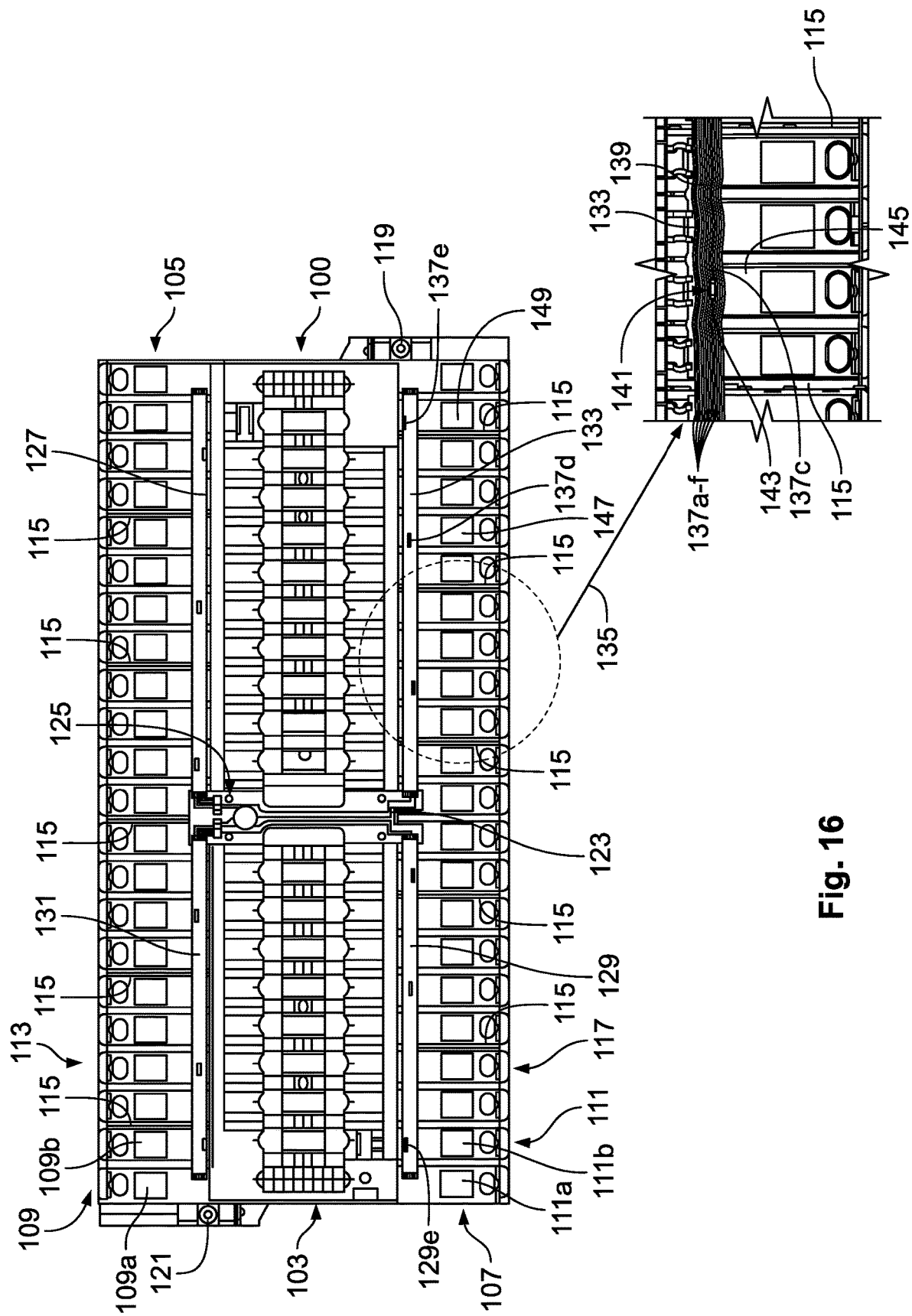
FIG. 16 illustrates a cell connecting system for a vehicle battery module according to the invention.

FIG. 16 illustrates a cell connecting system 100 used for a battery module related to the second object of the invention.

Such a cell connecting system 100 is used in electric or hybrid vehicles. It receives battery cells that are connected in parallel and serial to provide the energy to the electric motor of the vehicle.

The cell connecting system 100 comprises a support 103, typically made out of plastic, onto which two rows 105, 107 of a plurality of contact elements 109 and 111, typically made of aluminium, are mount, e.g. using a snap fit connection. The contact elements 109, 111 correspond to the electrical connection counterpart 2 of the embodiments described above.

In this embodiment, each contact element 109 and each contact element 111 comprises two contact element sections 109a, 109b and 111a, 111b respectively. The two contact element sections 109a, 109b are electrically connected to each other. The contact element sections 111a, 111b are also electrically connected to each other.

In use, a battery cell is positioned with its electrical plus and minus poles onto opposing contact sections. Thus, one battery cell on contact element section 109a, 111a and one battery cell on contact element sections 109b, 111b are formed. Therefore, the battery cells are arranged in parallel. In a variant, less or more than two cells could be arranged in parallel. The battery cell is usually welded to the contact element sections to ensure a reliable electrical and mechanical connection.

In row 105, the neighbouring contact element 113 is electrically isolated from the contact element 109 via an isolating element 115, usually integrally formed with the support. In the opposing row, the neighbouring contact element 117 is electrically connected to the contact element 111. Thus, the battery cells mount on contact elements 113 and 117 will be mount in series with respect to the battery cells mount on contact elements 109 and 111. The arrangement of pairs of battery cells in parallel connected in series with the neighbouring pair of battery cell is realized over the entire rows 105 and 107. Thus, pairs of electrically connected contact elements are separated from the subsequent pair of electrically connected elements by an isolating element 115. In this embodiment, only the contact element 109 in row 105 and the contact element 149 in row 107 are not electrically connected to a neighbouring contact element.

The cell connecting system 100 is connected to neighbouring cell connecting systems or the motor via the bus bars 119 and 121.

The cell connecting system 100 further comprises a printed circuit board (PCB) 123 with a cell monitoring unit 125. The monitoring unit 125 on the PCB 123 is electrically connected to at least some of the contact elements 109, 111, 113, 115 to monitor a parameter of the battery cell, for example, temperature, capacitance in order to balance the capacitance, or its charging state. The connection is realized using sensing cables, embodied as flexible flat cables 127, 129, 131 and 133, also called flexible flat conductor cables in the embodiments described above.

As can be seen in the enlarged view 135, the flexible flat cable 133, comprises a plurality, here six, parallel copper wires 137a-f isolated from each other by an electrical insulation or isolation 139, in this embodiment embedded in an extruded PVC. Three of the wires, 137c, 137d and 137e are electrically and mechanically connected to one and only one contact element, here 145, 147 and 149. In addition, as can be seen in FIG. 1, each pair of opposing contact elements only has one wire connected, specifically wire 137d and contact element 147, whereas the opposing contact element in row 105 is without connection to the flexible flat cable 127 to monitor the battery cells mount. The opposing contact elements 109a and 111a are each connected to their corresponding flexible flat cable 129 and 131.

The flexible flat cable 133 has an exposed region 141, in which the wire 143, corresponding to wire 137c, is devoid of its electrical isolation. Wire 143 is welded to the contact element 145, typically by ultrasonic welding. To carry out the ultrasonic welding, also the side opposite to where the contact with the contact element 145 is realized needs to be devoid of the electrical isolation 139 as can be seen in FIG. 1, as a sonotrode used to carry out the welding needs to be positioned onto the wire. Typically, the surface onto which the sonotrode was applied carries a visible imprint of the sonotrode's contact surface.

According to the invention, the exposed region 141 facing the contact element 145 comprises surface area enhancing features, like bumps. In this context, surface area enhancing feature means a surface with a larger area than a smooth surface of the copper wire, obtained after removal of the electrical isolation 139 e.g., using a CO2 laser and subsequent cleaning, like a mechanical cleaning using metal and/or plastic brushes, for example, round brushes.

Figure 17A:
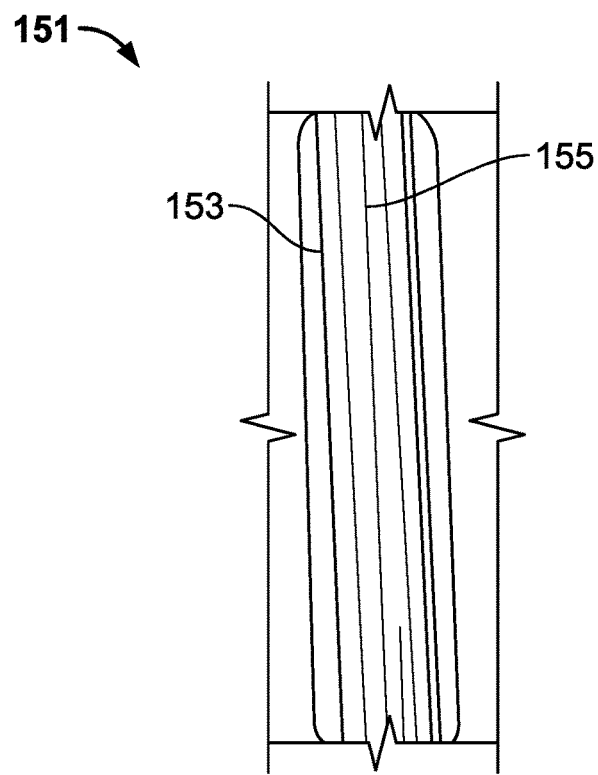
FIGS. 17a to 17c illustrate schematically variants of surface area enhancing features according to the invention.
Figure 17B:
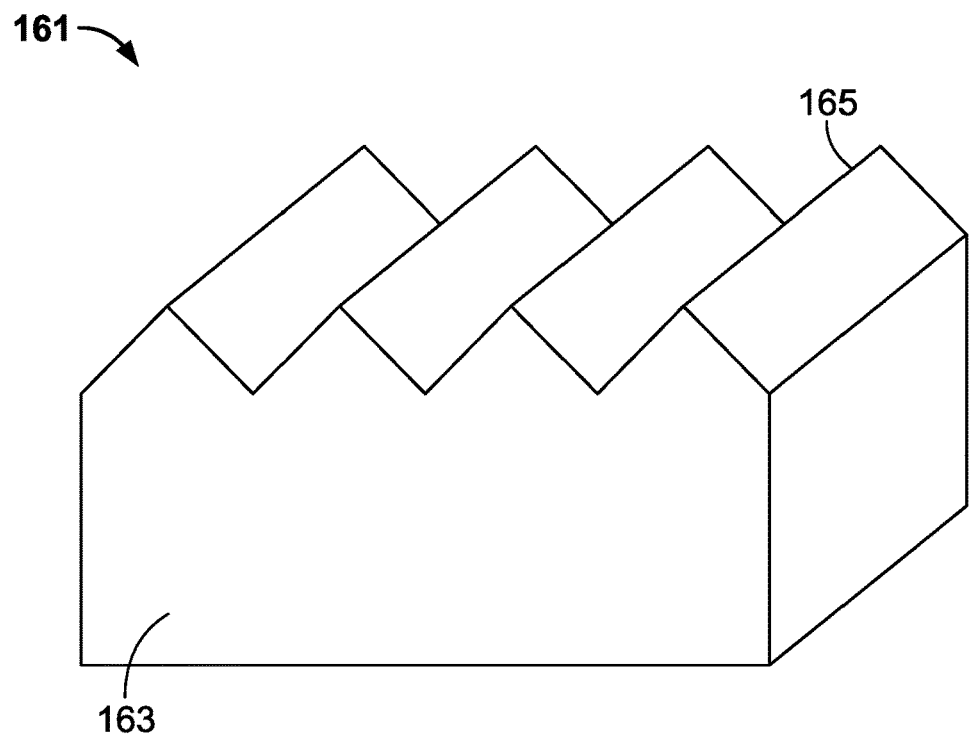
Figure 17C:
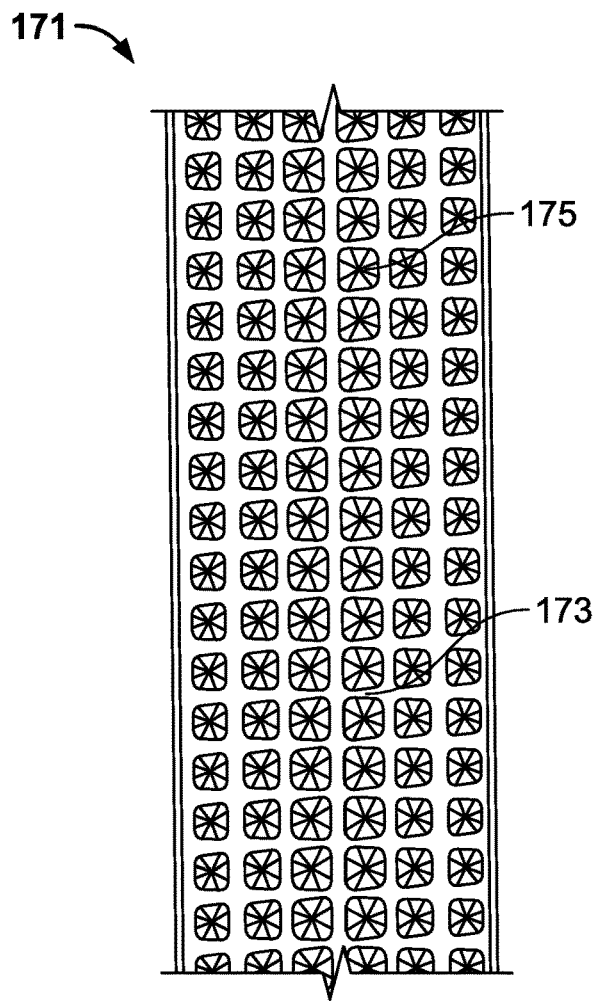

FIGS. 17a to 17c illustrate three different variants of surface area enhancing features on the exposed region 141 of the wire 143 according to the invention. The surface area enhancing features are on the side of the wire that will be in contact with the contact element 145 as shown in FIG. 16.

FIG. 17a illustrates the surface of the exposed region 151 of wire 153 after the application of a scratching tool. Scratches 155 are preferably provided over the entire surface of the exposed area and enhance the surface area compared to a smooth surface.

FIG. 17b illustrates the surface of the exposed region 161 of wire 163 after the application of a stamping punch, leading to patterned surface area enhancing features in the form of linear bumps 165 extending along the longer side of exposed region 161. In a further variant, the linear bumps 165 could extend along the short side or be oblique. In this embodiment, all linear bumps 165 have the same shape. In a variant, they could also be different, e.g. higher towards the edge. The linear bumps 165 have a height of up to 0.5 mm, in particular up to 0.2 mm, more in particular a height of up to 0.1 mm. Furthermore the peaks of directly neighbouring bumps have a distance from each other of up to 5 mm, in particular of up to 0.2 mm.

Figure 18:
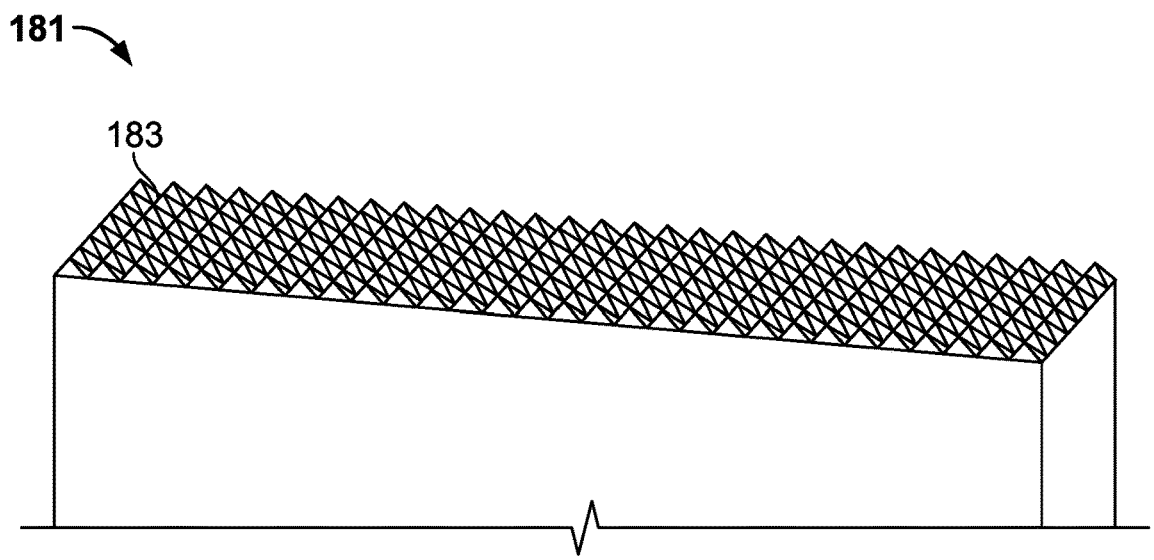
FIG. 18 illustrates a stamping punch with peaked pyramids to form surface enhancing features in a wire.

FIG. 17c illustrates the surface of the exposed region 171 of wire 173 after the application of a stamping punch 181, as illustrated in FIG. 18, leading to patterned surface area enhancing features in the form of an array of pyramids 175 over the entire exposed region 171. In this embodiment, the pyramids 175 are peaked pyramids with an essentially rectangular, in particular essentially square based shape, and a flank-angle of about 30° to 60°, in particular 45°. The pyramids 175 have a height of up to 0.5 mm, in particular up to 0.2 mm, more in particular a height of up to 0.1 mm. Furthermore, the peaks of directly neighbouring pyramids have a distance from each other of up to 5 mm, in particular of up to 0.2 mm.

As shown in FIG. 18, the stamping punch 181 comprises an array of regularly arranged pyramids 183.

Instead of embossing the surface area enhancing features into the surface of the wire 163 or 173, it is also possible to use a laser patterning process.

The invention also relates to a method for attaching a sensing cable to a contact element of a cell connecting system as described above and comprising the steps of, removing the electrical isolation 139 from the flexible flat cables 127 to 133 to form exposed regions 141, 151, 161, 171 and cleaning the exposed regions. This step is then followed by a surface area enhancing features forming step using a stamping punch or scratching tool or by laser structuring to obtain one of the structures as shown in FIG. 17a, 17b or 17c. Subsequently, the electrical and mechanical connection between the exposed regions 141, 151, 161, 171 of the wires 143, 153, 163, 173 is realized via welding, in particular ultrasonic or laser welding.

According to a variant, the forms as illustrated in FIGS. 17a to 17c could also or alternatively be provided on the surface of the contact element 145.

Figure 19:
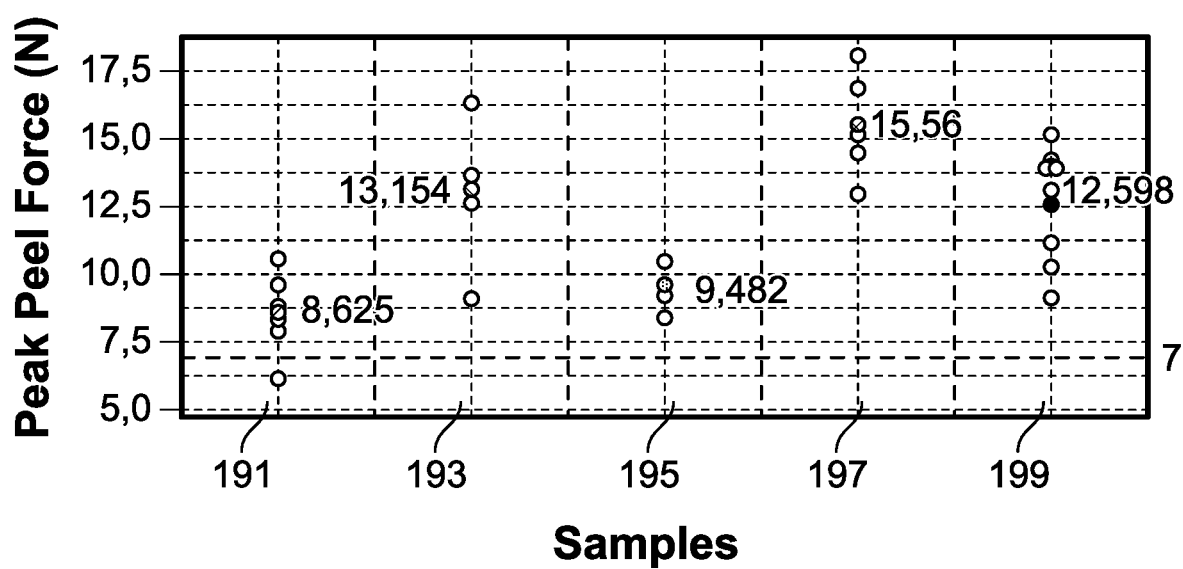
FIG. 19 illustrates peel off forces for four practical examples according to the invention compared to a comparative example with smooth surface.

FIG. 19 illustrates the results obtained after a 90° peel tension test as described above, the test satisfying Cmk>1.67. It shows the individual measurements and the average value.

For all samples the same materials, aluminium and copper were used for the contact element respectively the wire and the same ultrasonic process was applied.

Sample 191 corresponds to a comparative sample having a smooth surface. As can be seen the peel tension test is satisfying as the average value of 8.625N is higher than the needed 7N, see dotted horizontal line.

Sample 193 corresponds to surface area enhancement features in the form of peaked pyramids as illustrated in FIG. 17c, formed using a stamping punch as illustrated in FIG. 18. The peaked pyramids on the wire essentially show a square ground surface along the 0° and 90° direction, and on average present a distance between the peaks of 0.4 mm, a height of 0.2 mm and a flank angle of 45°. The average peel off force obtained is 13.154N with all measurements above 7N.

Sample 195 corresponds to surface area enhancement features in the form of linear pumps as illustrated in FIG. 17b, a distance between the peaks of 0.2 mm, a height of 0.1 mm and a flank angle of 45°. The average peel off force obtained is 9.482N with all measurements above 7N.

Sample 197 corresponds to surface area enhancement features in the form of peaked pyramids as illustrated in FIG. 17c. They were obtained by using a stamping punch as illustrated in FIG. 18. The peaked pyramids on the wire essentially show a square ground surface along the 0° and 90° direction, and on average present a distance between the peaks of 0.2 mm, a height of 0.1 mm and a flank angle of 45°. The average peel off force obtained is 15.56N with all measurements above 7N.

Sample 199 corresponds to surface area enhancement features in the form of scratches. The average peel off force obtained is 12.598N with all measurements above 7N.

All samples according to the invention have a higher peel off force compared to a wire with a smooth surface. The best results are obtained with Sample 197 showing an improvement of about 80% to the comparative sample.

It should be appreciated by those skilled in this art that the above embodiments are intended to be illustrative, and many modifications may be made to the above embodiments by those skilled in this art, and various structures described in various embodiments may be freely combined with each other without conflicting in configuration or principle.

Although the present disclosure have been described hereinbefore in detail with reference to the attached drawings, it should be appreciated that the disclosed embodiments in the attached drawings are intended to illustrate the preferred embodiments of the present disclosure by way of example, and should not be construed as limitation to the present disclosure.

Although several exemplary embodiments have been shown and described, it would be appreciated by those skilled in the art that various changes or modifications may be made to these embodiments without departing from the principles and spirit of the invention, the scope of which is defined by the claims and their equivalents.

It should be noted that, the word "comprise" doesn't exclude other elements or steps, and the word "a" or "an" doesn't exclude more than one. In addition, any reference numerals in the claims should not be interpreted as the limitation to the scope of the present disclosure.

What is claimed is:

1. An electrical device, comprising:
a conductor cable including an electrical conductor, the conductor is embedded in an insulation sheath of the conductor cable in a contact plane, the electrical conductor is stripped of the insulation sheath in a predetermined contact section at least on one contact side, the contact section of the conductor is bent out with the contact side from the contact plane to a position beyond the insulation sheath; and
an electrical connection counterpart, the contact side of the contact section of the conductor rests on the electrical connection counterpart and is connected directly to the electrical connection counterpart to form an electrical contact.

2. The electrical device according to claim 1, wherein the contact section of the conductor is bent with the contact side in a first direction out of the contact plane to beyond an outer side of the insulation sheath, the contact side of the contact section of the conductor rests on the electrical connection counterpart and is directly connected to the electrical connection counterpart, and the conductor cable is bent in the region of the contact section in a second direction, the second direction points in the direction opposite to the first direction.

3. The electrical device according to claim 1, wherein the contact side of the contact section of the electrical conductor is connected to the electrical connection counterpart by way of a plurality of contact points.

4. The electrical device according to claim 1, wherein the contact section of the electrical conductor is separated into two partial sections, at least one partial section of the electrical conductor rests with the contact side the electrical connection counterpart and is connected to the connection counterpart.

5. The electrical device according to claim 1, wherein the contact section of the electrical conductor is embedded in insulating material.

6. The electrical device according to claim 1, wherein the connection counterpart and the conductor are formed from different electrically conductive materials.

7. The electrical device according to claim 6, wherein the connection counterpart is aluminum and the conductor is copper.

8. The electrical device according to claim 1, wherein the electrical connection counterpart is a contact of an electrical terminal of a battery.

9. The electrical device according to claim 1, wherein the electrical conductor is connected to the electrical connection counterpart by way of a welded connection.

10. The electrical device according to claim 1, wherein the contact section is at least partially embossed into the electrical connection counterpart.

11. The electrical device according to claim 10, wherein the interface between the contact section and the electrical connection counterpart is positioned below the surface of the connection counterpart immediately adjacent the interface.

12. The electrical device according to claim 11, wherein the surface of the contact section and the surface of the electrical connection counterpart include mating surface area enhancing features at the interface.

13. The electrical device according to claim 1, wherein:
the electrical connection counterpart includes a contact element for receiving an electrical pole of at least one battery cell;
the conductor cable defines a sensing cable having a wire electrically and mechanically connecting a cell monitoring unit and the contact element; and
the surface of the wire and/or the contact element includes surface area enhancing features in the area of contact with each other.

14. The electrical device according to claim 13, wherein the surface area enhancing features include a plurality of bumps.

15. The electrical device according to claim 14, wherein the bumps extend linearly.

16. The electrical device according to claim 15, wherein the bumps have a peaked pyramidal shape.

17. The electrical device according to claim 16, wherein the pyramidal shape has a rectangular base shape, and a flank-angle of 30° to 60°.

18. The electrical device according to claim 14, wherein the bumps have a height of up to 0.5 mm.

19. The electrical device according to claim 14, wherein the peaks of directly adjacent bumps have a distance from each other of up to 5 mm.

20. The electrical device according to claim 13, wherein the wire and the contact element are welded together.

21. The electrical device according to claim 20, wherein the contact element is aluminum and the wire is copper.

22. The electrical device according to claim 21, further comprising a plurality of contact elements arranged in two rows for enabling a serial electrical connection of battery cells, one of mutually opposing contact elements is electrically and mechanically connected with the wire of the sensing cable.

23. The electrical device according claim 22, wherein the sensing cable includes a plurality of parallel wires embedded in an electrical isolation, wherein each one of the wires that are connected to a contact element is electrically and mechanically connected to a different one of the contact elements and wherein the electrical isolation is removed in each area of contact.

* * * * *